(12) United States Patent
Fan

(10) Patent No.: US 6,238,837 B1
(45) Date of Patent: May 29, 2001

(54) FLEXOGRAPHIC ELEMENT HAVING AN INFRARED ABLATABLE LAYER

(75) Inventor: Roxy Ni Fan, E. Brunswick, NJ (US)

(73) Assignee: E.I. du Pont de Nemours and Company, Wilmington, DE (US)

(*) Notice: Subject to any disclaimer, the term of this patent is extended or adjusted under 35 U.S.C. 154(b) by 0 days.

(21) Appl. No.: 08/432,450

(22) Filed: May 1, 1995

(51) Int. Cl.$^7$ ...................................................... G03C 1/73
(52) U.S. Cl. .................. 430/273.1; 430/306; 430/271.1; 430/944; 430/945
(58) Field of Search .................. 430/273.1, 306, 430/271.1, 944, 945

(56) References Cited

U.S. PATENT DOCUMENTS

| | | | |
|---|---|---|---|
| 3,458,311 | 7/1969 | Alles | 430/276 |
| 4,020,762 | 5/1977 | Peterson | 101/467 |
| 4,093,684 | 6/1978 | Parts et al. | 430/270 X |
| 4,165,395 | * 8/1979 | Chang | 427/43 |
| 4,195,108 | * 3/1980 | Gazard et al. | 430/5 |
| 4,469,775 | 9/1984 | Lynch et al. | 430/273 |
| 4,555,471 | 11/1985 | Barzynski et al. | 430/273 |
| 4,806,506 | 2/1989 | Gibson, Jr. | 430/306 |
| 4,894,315 | 1/1990 | Feinberg et al. | 430/306 |
| 5,085,976 | 2/1992 | Gibson, Jr. et al. | 430/306 |
| 5,171,650 | 12/1992 | Ellis et al. | 430/201 |

FOREIGN PATENT DOCUMENTS

| | | | |
|---|---|---|---|
| 41 07 378A1 | 9/1992 | (DE) | G03F/1/14 |
| 0 459 655A2 | 12/1991 | (EP) | G03F/7/09 |
| 1 529 590 | 10/1978 | (GB) | H04N/1/02 |
| 52-25329 | 7/1977 | (JP) | G03C/1/76 |
| 1-118842 | 5/1989 | (JP) | G03F/7/00 |
| WO 90/12342 | 10/1990 | (WO) | G03C/1/492 |
| WO 92/06410 | 4/1992 | (WO) | G03C/1/72 |

OTHER PUBLICATIONS

Patent Abstracts of Japan, vol. 007, No. 138 (P–204), Jun. 16, 1983 & JP–A–58 052646 (Dainippon Insatsu KK), Mar. 28, 1983, Abstract.

B. F. Griffing, "On Operational Two Level Photoresist Technology", *Conference: International Electron Devices Meeting,* Washington, DC (Dec. 7–9, 1981), PP 562–565, IEEE.

* cited by examiner

*Primary Examiner*—Laura Weiner
(74) *Attorney, Agent, or Firm*—Thomas H. Magee

(57) ABSTRACT

A photosensitive element for use as a photopolymer printing plate comprising a support, a layer of a photopolymerizable material on the support, and an infrared ablation layer which is ablatable by infrared radiation and substantially opaque to actinic radiation on the photopolymerizable material. The infrared ablation layer comprises at least one infrared absorbing material, a radiation opaque material, and at least one binder which is substantially incompatible with low molecular weight materials in the photopolymerizable layer. The infrared ablation layer is tack-free or substantially tack-free on the photopolymerizable layer. The infrared ablation layer is ablatable from the surface of the photopolymerizable layer upon exposure to infrared laser radiation.

12 Claims, No Drawings

FLEXOGRAPHIC ELEMENT HAVING AN INFRARED ABLATABLE LAYER

BACKGROUND OF THE INVENTION

1. Field of the Invention

This invention relates to a process for making a flexographic printing plate from a photosensitive printing element, particularly a flexographic element having an infrared radiation ablatable layer capable of being selectively removed by a laser beam.

2. Description of the Prior Art

Flexographic printing plates are well known for use in printing, particularly on surfaces which are soft and easily deformable, such as packaging materials, e.g., cardboard, plastic films, etc. Flexographic printing plates can be prepared from photopolymerizable compositions, such as those described in U.S. Pat. Nos. 4,323,637 and 4,427,749. The photopolymerizable compositions generally comprise an elastomeric binder, at least one monomer and a photoinitiator. Photosensitive elements generally have a photopolymerizable layer interposed between a support and a coversheet or multilayer cover element. Upon imagewise exposure to actinic radiation, polymerization, and hence, insolubilization of the photopolymerizable layer occurs in the exposed areas. Treatment with a suitable solvent removes the unexposed areas of the photopolymerizable layer leaving a printing relief which can be used for flexographic printing.

Imagewise exposure of a photosensitive element requires the use of a phototool which is a mask having clear and opaque areas covering the photopolymerizable layer. The phototool prevents exposure and polymerization in the opaque areas. The phototool allows exposure to radiation in the clear areas so that these areas polymerize and remain on the support after the development step. The phototool is usually a photographic negative of the desired printing image. If corrections are needed in the final image a new negative must be made. This is a time-consuming process. In addition, the phototool may change slightly in dimension due to changes in temperature and humidity. Thus, the same phototool, when used at different times or in different environments, may give different results and could cause registration problems.

Thus, it would be desirable to eliminate the phototool by directly recording information on a photosensitive element, e.g., by means of a laser beam. The image to be developed could be translated into digital information and the digital information used to place the laser for imaging. The digital information could even be transmitted from a distant location. Corrections could be made easily and quickly by adjusting the digitized image. In addition, the digitized image could be either positive or negative, eliminating the need to have both positive-working and negative-working photosensitive materials, or positive and negative phototools. This saves storage space and, thus, reduces cost. Another advantage is that registration can be precisely controlled by machine during the imaging step. Digitized imaging without a phototool is particularly well-suited for making seamless, continuous printing forms.

In general, it has not been very practical to use lasers to image the photopolymerizable layer of the elements which are used to prepare flexographic printing plates. The elements have low photosensitivity and require long exposure times even with high powered lasers. In addition, most of the photopolymerizable materials used in these elements have their greatest sensitivity in the ultraviolet range. While UV lasers are known, economical and reliable UV lasers with high power, such as the ion laser, are generally not available. In UV lasers, such as the excimer laser, the laser cannot be modulated quickly enough to create a precise image at high write speeds. However, non-UV lasers are available which are relatively inexpensive, and which have a useful power output and which can be utilized to form a mask image on top of flexographic printing elements.

U.S. Pat. No. 5,262,275 and pending U.S. patent application Ser. No. 08/341,731, (IM-0672B) describe a photosensitive element and a process for making flexographic plates, respectively. The element comprises a support, a photopolymerizable layer, at least one barrier layer, and at least one layer of infrared radiation sensitive material. The process includes the step of imagewise ablation of the layer of infrared radiation sensitive material with infrared laser radiation to form a mask. The element is then exposed to actinic radiation through the mask and treated with developer solution. This method requires the photosensitive element to contain a barrier layer between the photopolymerizable layer and the infrared sensitive layer. This barrier layer complicates the manufacturing process and increases costs for producing laser ablatable flexographic plates.

Patent application publication WO 94/03839 discloses a photosensitive element and a process for preparing a relief image. The element includes a support, a photosensitive layer, at least one infrared radiation sensitive layer which is substantially opaque to actinic radiation; and a coversheet. Optionally, a barrier layer is interposed between the photosensitive layer and the infrared-sensitive layer. When the element is not imaged and developed immediately after it is put together, it is preferred that a barrier layer be present. The infrared-sensitive layer has an adhesion balance between the coversheet layer and the photosensitive layer or barrier layer such that it adheres more strongly to one of the layers. The process includes imagewise exposing the element to infrared laser radiation through the coversheet. After exposure to infrared laser radiation the infrared-sensitive layer adheres more strongly to the layer to which it had lower adhesion prior to the exposure. The coversheet is then removed having adhered thereto part of the infrared radiation sensitive layer, creating an actinic radiation opaque mask on the photosensitive layer (or barrier layer). The element is then exposed overall to actinic radiation through the mask and developed to form a relief. In this application imagewise exposure to laser radiation changes the adhesion of the infrared sensitive layer.

EP 0 634 695 A1 discloses a laser-imageable flexographic printing plate in which a slip layer doped with a UV absorber is laminated to a photopolymer layer. The slip layer is ablated from the photopolymer layer using a laser operating at a wavelength between 300 to 400 nm to create an in situ negative. The uncured plate is then flood-exposed to UV light in the usual fashion and developed. One disadvantage is that since both the slip layer and the photopolymer layer are sensitive to UV radiation, the laser must be carefully controlled to only selectively ablate the slip layer containing the UV absorber from the UV sensitive photopolymer layer without detrimentally affecting the photopolymer layer itself.

SUMMARY OF THE INVENTION

In accordance with this invention there is provided a photosensitive element for use as a photopolymer printing plate comprising:

(a) a support;

(b) at least one layer of a photopolymerizable material on the support, the photopolymerizable material comprising at least one elastomeric binder, at least one monomer, at least one initiator having sensitivity to non-infrared actinic radiation, and optionally at least one plasticizer, wherein at least one of the monomer and the optional plasticizer is a low molecular weight material; and (c) at least one infrared ablation layer which is ablatable by infrared radiation and substantially opaque to actinic radiation on the at least one layer of photopolymerizable material (b), the infrared ablation layer comprising;
  (i) at least one infrared absorbing material;
  (ii) a radiation opaque material, wherein (i) and (ii) can be the same or different; and
  (iii) at least one binder which is substantially incompatible with at least one of the low molecular weight materials of layer (b); and optionally, (d) a coversheet;
  wherein the infrared ablation layer is tack-free or substantially tack-free on the photopolymerizable layer and is ablatable from the surface of the photopolymerizable layer upon exposure to infrared laser radiation after removal of the coversheet, if present.

In accordance with this invention there is provided a process for making a flexographic photopolymer printing plate from the photosensitive element described above.

DETAILED DESCRIPTION OF INVENTION

The element and process of the invention combines the convenience and sensitivity of infrared laser imaging with conventional photopolymerizable compositions to produce flexographic printing plates with known good printing quality quickly, economically, and by digital imaging means. Surprisingly, the photosensitive element of this invention does not require the presence of a barrier layer between a photopolymerizable layer and an infrared radiation sensitive layer in order to overcome the tackiness and provide an oxygen barrier. Advantageously, the elimination of the barrier layer simplifies the manufacturing process, improves the coating yield and reduces costs.

The photosensitive element comprises, in order, a support, a photopolymerizable layer, and a layer of infrared radiation sensitive material. The term "infrared radiation sensitive" will be used throughout the specification interchangeably with the term "infrared sensitive".

The support can be any flexible material which is conventionally used with photosensitive elements used to prepare flexographic printing plates. Examples of suitable support materials include polymeric films such those formed by addition polymers and linear condensation polymers, transparent foams and fabrics, and metals such as aluminum. It is preferred that the support be transparent to actinic radiation (which throughout this specification will be meant to include ultraviolet radiation and/or visible light), and optionally transparent to infrared radiation, i.e., allow the radiation to pass through the support unattenuated or substantially unattenuated. It is understood that a metal support is not transparent to radiation, but this is acceptable under certain end-use applications. A preferred support is a polyester film; particularly preferred is polyethylene terephthalate. The support typically has a thickness from 2 to 10 mils (0.0051 to 0.025 cm), with a preferred thickness of 3 to 8 mils (0.0076 to 0.020 cm).

As used herein, the term "photopolymerizable" is intended to encompass systems which are photopolymerizable, photocrosslinkable, or both. The photopolymerizable layer comprises an elastomeric binder, at least one monomer and an initiator, where the initiator has a sensitivity to non-infrared actinic radiation. In most cases, the initiator will be sensitive to visible and/or ultraviolet radiation. Any photopolymerizable compositions which are suitable for the formation of flexographic printing plates can be used for the present invention. Examples of suitable compositions have been disclosed, for example, in Chen et al., U.S. Pat. No. 4,323,637; Gruetzmacher et al., U.S. Pat. No. 4,427,749 and Feinberg et al., U.S. Pat. No. 4,894,315.

The elastomeric binder can be a single polymer or mixture of polymers which can be soluble, swellable or dispersible in aqueous, semi-aqueous or organic solvent developers. Binders which are soluble or dispersible in aqueous or semi-aqueous developers have been disclosed in Alles, U.S. Pat. No. 3,458,311; Pohl, U.S. Pat. No. 4,442,302; Pine, U.S. Pat. No. 4,361,640; Inoue et al., U.S. Pat. No. 3,794,494; Proskow, U.S. Pat. No. 4,177,074; Proskow, U.S. Pat. No. 4,431,723; and Worns, U.S. Pat. No. 4,517,279. Binders which are soluble, swellable or dispersible in organic solvent developers include natural or synthetic polymers of conjugated diolefin hydrocarbons, including polyisoprene, 1,2-polybutadiene, 1,4-polybutadiene, butadiene/acrylonitrile, butadiene/styrene thermoplastic-elastomeric block copolymers and other copolymers. The block copolymers discussed in Chen U.S. Pat. No. 4,323,636; Heinz et al., U.S. Pat. No. 4,430,417; and Toda et al., U.S. Pat. No. 4,045,231 can be used. It is preferred that the binder be present in at least an amount of 65% by weight of the photosensitive layer.

The term binder, as used herein, encompasses core shell microgels and blends of microgels and preformed macromolecular polymers, such as those disclosed in Fryd et al., U.S. Pat. No. 4,956,252.

The photopolymerizable layer can contain a single monomer or mixture of monomers which must be compatible with the binder to the extent that a clear, non-cloudy photosensitive layer is produced. Monomers that can be used in the photopolymerizable layer are well known in the art and include, but are not limited to, addition-polymerization ethylenically unsaturated compounds having relatively low molecular weights (generally less than about 30,000). Preferably, the monomers have a relatively low molecular weight, less than about 5000. Unless described otherwise, throughout the specification molecular weight is the weighted average molecular weight. Examples of suitable monomers include, but are not limited to, t-butyl acrylate, lauryl acrylate, the acrylate and methacrylate mono- and poly-esters of alcohols and polyols such as alkanols, e.g., 1,4-butanediol diacrylate, 2,2,4-trimethyl-1,3 pentanediol dimethacrylate, and 2,2-dimethylolpropane diacrylate; alkylene glycols, e.g., tripropylene glycol diacrylate, butylene glycol dimethacrylate, hexamethylene glycol diacrylate, and hexamethylene glycol dimethacrylate; trimethylol propane; ethoxylated trimethylol propane; pentaerythritol, e.g., pentaerythritol triacrylate; dipentaerythritol; and the like. Other examples of suitable monomers include acrylate and methacrylate derivatives of isocyanates, esters, epoxides and the like, such as decamethylene glycol diacrylate, 2,2-di(p-hydroxyphenyl)propane diacrylate, 2,2-di(p-hydroxyphenyl)propane dimethacrylate, polyoxyethyl-2,2-di(p-hydroxyphenyl)propane dimethacrylate, and 1-phenyl ethylene-1,2-dimethacrylate. Further examples of monomers can be found in Chen, U.S. Pat. No. 4,323,636; Fryd et al., U.S. Pat. No. 4,753,865; Fryd et al., U.S. Pat. No. 4,726,877 and Feinberg et al., U.S. Pat. No. 4,894,315. It is preferred that the monomer be present in at least an amount of 5% by weight of the photopolymerizable layer.

The photoinitiator can be any single compound or combination of compounds which is sensitive to non-infrared actinic radiation, generating free radicals which initiate the polymerization of the monomer or monomers without excessive termination. The photoinitiator is generally sensitive to visible or ultraviolet radiation, preferably ultraviolet radiation. The photoinitiator must also be insensitive to infrared radiation and should be thermally inactive at and below 185° C. Examples of suitable photoinitiators include the substituted and unsubstituted polynuclear quinones. Examples of suitable systems have been disclosed in Gruetzmacher, U.S. Pat. No. 4,460,675 and Feinberg et al., U.S. Pat. No. 4,894,315. Photoinitiators are generally present in amounts from 0.001% to 10.0% based on the weight of the photopolymerizable composition.

The photopolymerizable layer can contain other additives depending on the final properties desired. Such additives include sensitizers, plasticizers, rheology modifiers, thermal polymerization inhibitors, tackifiers, colorants, antioxidants, antiozonants, or fillers.

Plasticizers are used to adjust the film-forming properties of the elastomer. Examples of suitable plasticizers include aliphatic hydrocarbon oils, e.g., naphthenic and paraffinic oils; liquid polydienes, e.g., liquid polybutadiene; liquid polyisoprene. Generally, plasticizers are liquids having molecular weights of less than about 5,000, but can have molecular weights up to about 30,000. Plasticizers having low molecular weight will encompass molecular weights less than about 30,000.

The thickness of the photopolymerizable layer can vary over a wide range depending upon the type of printing plate desired. For so-called "thin plates" the photopolymerizable layer can be from about 20 to 67 mils (0.05 to 0.17 cm) in thickness. Thicker plates will have a photopolymerizable layer up to 100–250 mils (0.25 to 0.64 cm) in thickness or greater.

In general, the photopolymerizable layer contains one or more compounds which can migrate to the surface of the photopolymer layer and possibly into adjacent layers. In general, low molecular weight compounds, i.e., molecular weight less than 30,000, are migratory. Low molecular weight compounds which are migratory are primarily liquids but can also include low melting solid materials. Examples of such migratory materials include monomers and plasticizers. The migratory materials tend to migrate over time if they are compatible with materials in adjacent layers. If such migration occurs into the infrared sensitive layer, then the infrared sensitivity of that layer can be altered.

In conventional photopolymer elements, a release layer on the photopolymer layer was necessary to minimize the migration of materials between the photopolymerizable layer and another layer as well as to shield the photopolymer layer from the atmospheric oxygen when the photopolymerizable layer is overall exposed to actinic radiation. Similarly, in the photosensitive element of U.S. Pat. No. 5,262,275 and pending U.S. patent application Ser. No. 08/341,731, (IM-0672B) a barrier layer is required between the photopolymer layer and the infrared sensitive layer to shield the photopolymerizable layer from atmospheric oxygen and to minimize migration of materials between the photopolymerizable layer and the infrared sensitive layer.

Surprisingly, it has been discovered that a barrier layer between the photopolymerizable layer and the infrared sensitive layer is not necessary to provide a tack-free surface to the infrared sensitive layer when the infrared-sensitive layer of the present invention is used. The infrared sensitive layer on the photopolymerizable layer is tack-free when the binder of the infrared sensitive layer has minimum or no compatibility with low molecular weight materials in the photopolymerizable layer. Also, it was surprising that good photopolymerization of the photosensitive element not having a barrier layer was obtained upon exposure, i.e., without a shield to atmospheric oxygen.

Further, it was most surprising that there are advantages to the ultimate print quality of a photosensitive element which does not contain a barrier layer. A photosensitive element having a barrier layer generally has higher stain in the ablated areas than a photosensitive element without a barrier layer, when both elements are exposed with the same laser fluence. Also, wrinkling of the surface of the element occurred in a photosensitive element having a barrier layer when the photosensitive element was imagewise ablated in the round (i.e., on a drum) and treated in a flat orientation, i.e., UV exposed and washed out. No wrinkling is observed for photosensitive elements without a barrier layer given the same ablation and treating orientation. Wrinkles and higher stain are undesirable. Wrinkles result in poor printing quality, i.e., printable stretch marks and low solid density in the solid areas. Higher stain results in low photo speed.

On the photopolymerizable layer, there is at least one infrared radiation sensitive layer, i.e., an infrared ablation layer which is ablatable, i.e., vaporizes and/or decomposes by exposure to infrared laser radiation. The at least one infrared sensitive layer includes (i) at least one infrared absorbing material, (ii) a radiation opaque material and (iii) at least one binder which is substantially incompatible with the at least one of the migratory materials of layer (b). The infrared sensitive layer is tack-free or substantially tack-free when on the photopolymerizable layer, and preferably is tack-free or substantially tack-free when not associated with a photopolymerizable layer.

The infrared-sensitive layer should be capable of absorbing infrared radiation and should be opaque to actinic radiation. A single material or a combination of materials can be used to provide capabilities of absorbing infrared radiation and blocking actinic radiation. This layer may be referred to as the "infrared-sensitive layer" or the "actinic radiation opaque layer" (radiation opaque layer). Although the infrared-sensitive layer is referred to herein as a single layer, it will be understood that two or more infrared-sensitive layers can be used. In the case where two or more infrared-sensitive layers are used, only the binders of the infrared sensitive layer which is adjacent to the photopolymerizable layer need to be incompatible with the migratory materials of the photopolymerizable layer. The properties of the infrared-sensitive layer can be modified by using other ingredients, such as, for example, plasticizers, pigment dispersants, surfactants, adhesion modifiers and coating aids, provided that they do not adversely affect the imaging properties of the element.

The infrared-absorbing material should have a strong absorption in the region of the infrared imaging radiation, typically 750 to 20,000 nm. Examples of suitable infrared-absorbing materials include dark inorganic pigments such as carbon black, graphite, copper chromite, chromium oxides and cobalt chrome aluminate. Dyes are also suitable as infrared-absorbing agents. Examples of suitable dyes include, poly(substituted)phthalocyanine compounds; cyanine dyes; squarylium dyes; chalcogenopyryloarylidene dyes; bis(chalcogenopyrylo)-polymethine dyes; oxyindolizine dyes; bis(aminoaryl)-polymethine dyes; merocyanine dyes; croconium dyes; metal thiolate dyes; and quinoid dyes.

Infrared-absorbing materials can be present in any concentration which is effective for the intended purpose. In general, for the organic compounds, concentrations of 0.1 to 80% by weight, based on the total weight of the infrared sensitive layer, have been found to be effective.

As initiators used in the photopolymerizable layer are often sensitive to actinic radiation in the ultraviolet and/or visible region, the infrared sensitive layer must be opaque to ultraviolet or visible radiation. Thus, the infrared sensitive layer should include a radiation-opaque material. Any material which prevents the transmission of actinic light to the photopolymerizable layer can be used in the infrared radiation sensitive material as the radiation-opaque material. Examples of suitable radiation-opaque materials include dyes which absorb ultraviolet or visible radiation, dark inorganic pigments and combinations thereof. Preferred radiation-opaque materials are carbon black and graphite. The concentration of carbon black as the radiation-opaque material is chosen so as to achieve the desired optical density, i.e., so that the radiation-opaque layer prevents the transmission of actinic radiation to the photopolymerizable layer. In general, a transmission optical density (OD) greater than 2.0 is preferred.

The dark inorganic pigments generally function as both infrared absorbing material and radiation-opaque material. Carbon black, graphite and mixtures thereof are particularly preferred dark inorganic pigments since they function as both the infrared absorbing agent and the radiation-opaque material in the infrared radiation sensitive material. Metals and alloys can also function as both the infrared absorbing material and radiation opaque material. To the extent that metals and alloys can be applied with the binder, they can also be used. Examples of metals include aluminum, copper, and zinc, and alloys of bismuth, indium and copper.

Radiation opaque materials can be present in any concentration that is effective for the intended purpose. The concentration of radiation-opaque material and infrared absorbing materials which are needed decreases with increasing thickness of the infrared sensitive layer. Thinner layers are preferred for higher ablation efficiency. In general, a concentration of 1–70% by weight, and preferably 10–60% by weight, based on the total weight of the infrared sensitive layer can be used. It is preferred when the infrared absorbing material is the same as the radiation opaque material to use 10–60% by weight, based on the total weight of the infrared sensitive layer.

As is known to those skilled in the art, since a dye alone is not sufficient to function as both the infrared absorbing material and radiation opaque material, at least two dyes would be required to provide both functionalities to the infrared radiation sensitive material. It is also contemplated that the combination of a dye with a pigment would provide both functions to the infrared sensitive layer.

It is generally preferred that the infrared-absorbing material and the radiation opaque material in the infrared sensitive layer adjacent to the photopolymerizable layer are non-migratory such that they do not migrate into the photopolymerizable layer. Thus, low molecular weight infrared-absorbing materials and/or the radiation-opaque materials, e.g., dyes, may not be suitable. However, dyes may be used in other infrared sensitive layers not adjacent to the photopolymerizable layer.

A dispersant is generally added when a pigment is present in the infrared-sensitive layer in order to disperse the fine particles and avoid flocculation and agglomeration. A wide range of dispersants is commercially available. Suitable dispersants are the A-B dispersants generally described in "Use of A-B Block polymers as Dispersants for Non-aqueous Coating Systems" by H. K. Jakubauskas, *Journal of Coating Technology*, Vol. 58; Number 736; pages 71–82. Useful A-B dispersants are disclosed in U.S. Pat. Nos. 3,684,771; 3,788,996; 4,070,388 and 4,032,698. The dispersant is generally present in an amount of about 0.1 to 10% by weight, based on the total weight of the layer.

The binder for the infrared sensitive layer is a polymeric material which is incompatible or substantially incompatible with at least one of the materials in the photopolymerizable layer which are migratory, that is, the monomer or monomers and plasticizers (when present). When the binder is incompatible or substantially incompatible with the migratory materials in the photopolymerizable layer, a barrier or release layer is not necessary between the infrared sensitive layer and the photopolymerizable layer. It is preferred that the binder for the infrared sensitive layer be tack-free or substantially tack-free. That is, the binder when incorporated into an infrared sensitive layer (and not associated with a photopolymerizable layer), should have no or only a slight stickiness or oilyness to the touch of the surface of the layer.

Further, when the infrared sensitive layer containing the binder is in contact with the photopolymerizable layer, the surface of the infrared sensitive layer remains tack-free or substantially tack-free. The incompatibility of the binder of the infrared sensitive layer to the migratory materials in the photopolymerizable layer is determined by touching the top surface, i.e., exposed surface, of the infrared sensitive layer after the infrared sensitive layer has been brought in contact (by conventional means such as lamination, coating, etc.) with the photopolymerizable layer. If the surface of the infrared sensitive layer is tack-free or only slightly tacky, sticky or oily to touch, the binder of the infrared sensitive layer is incompatible or substantially incompatible with the low molecular weight migratory materials in the photopolymer layer and is suitable for use in the present invention. If the surface of the infrared sensitive layer is tacky to the touch, the binder of the infrared sensitive layer is compatible with one or more of the migratory materials and the binder would not be suitable for use in the present invention. Generally, the tackiness or lack of tackiness of the top surface of the infrared sensitive layer will be apparent relatively quickly, i.e., immediately after the infrared sensitive layer and the photopolymerizable layer are brought together, particularly when done so under heat and pressure conditions of lamination. However, it may be desirable to wait about 12 to 16 hours after the infrared sensitive layer and the photopolymerizable layer are assembled to determine the ultimate tackiness or lack of tackiness of the surface of the infrared sensitive layer.

Since migratory materials such as monomers and plasticizers are generally compatible with each other in the photopolymerizable layer, the binder in the infrared sensitive layer would be incompatible or substantially incompatible with these migratory materials. However, the minimum acceptable condition is that the binder should be incompatible with at least the migratory material which most influences the surface condition, i.e., tackiness, of the top surface of the infrared sensitive layer when on the photopolymerizable layer. This migratory material may be the one present in the photopolymerizable layer in the highest proportion (compared to other migratory materials) and/or may be the most likely to migrate to influence the surface conditions of the infrared-sensitive layer. Thus, the binder is incompatible or substantially incompatible with at least one of the migratory materials, preferably is incompatible or substantially incompatible with more than one of the migratory materials, and most preferably is incompatible or substantially incompatible with all migratory materials in the photopolymerizable layer, of course, there may be other materials in the photopolymerizable layer which are migratory, such as dyes. However, to the extent that these materials do not influence the surface characteristics, i.e., tackiness, or the imaging characteristics, i.e., ablation of the infrared sensitive layer, they are not of particular concern.

The selection of a binder for the infrared sensitive layer as being incompatible or substantially incompatible with the migratory materials is relative to the components particular to the photopolymerizable layer. A binder which is incompatible or substantially incompatible with the migratory materials in a particular photopolymerizable layer, may or may not be incompatible with the migratory materials in a different photopolymerizable layer. For example, in aqueous-based photopolymer systems, some components in the photopolymerizable layer may be more likely to migrate than in solvent-based photopolymer systems, and thus the selection of binder may be different. Also, in photosensitive elements having more than one photopolymerizable layer, migratory materials of a photopolymerizable layer not adjacent to the infrared sensitive layer may migrate to the photopolymerizable layer adjacent to the infrared sensitive layer. Thus, binder selection may also be influenced by the migratory materials in a non-adjacent photopolymerizable layer.

In addition, the binder for the infrared sensitive layer should satisfy several requirements. (1) The binder should be removed or substantially removed by the heat generated by the infrared-absorbing material when the layer is exposed to infrared laser radiation. (2) The binder should be removable from the surface of the photopolymerizable layer after exposure to actinic radiation. (3) The binder should be one in which the other materials in the infrared-sensitive layer can be uniformly dispersed. (4) The binder should be capable of forming a uniform coating on the photopolymerizable layer.

Examples of materials which are suitable for use as the binder in the infrared sensitive layer which is adjacent to the photopolymerizable layer include those materials which are conventionally used as a release layer (also referred to as a slip layer or protective layer) in flexographic printing elements, such as polyamides; polyvinyl alcohol; copolymers of ethylene and vinyl acetate; amphoteric interpolymers; cellulosic polymers, such as hydroxyalkyl cellulose, and cellulose acetate butyrate; polybutyral; cyclic rubbers; and combinations thereof. Amphoteric interpolymers are described in U.S. Pat. No. 4,293,635 which is hereby incorporated by reference. Other materials suitable as the binder include self-oxidizable compounds such as nitrocellulose and nitroglycerine; non-self-oxidizing polymers such as alkylcellulose (e.g., ethylcellulose), polyacrylic acids and metal alkali salts thereof; polyacetals; polyimides; polycarbonates; polyesters; polyalkylenes, such as polyethylenes and polybutylenes; polyphenylene ethers; and polyethylene oxides; polylactones; and combinations thereof.

Preferred binders for the infrared sensitive layer are polyamides, polyvinyl alcohol, amphoteric interpolymers, alkylcellulose, cellulosic polymers particularly hydroxypropyl cellulose and hydroxyethyl cellulose, nitrocellulose, copolymers of ethylene and vinyl acetate, cellulose acetate butyrate, polybutyrals, cyclic rubbers, and combinations thereof. Binders are generally present in amounts from 40% to 90% by weight, based on the total weight of the infrared sensitive layer.

It should be understood that not all the binders described above are incompatible with all the migratory materials described in the photopolymerizable layer. It is within the knowledge of one skilled in the art to select both the binder in the infrared sensitive layer and the migratory materials in the photopolymerizable layer such that the binder is substantially incompatible or incompatible with the migratory materials as well as to select a binder which is substantially incompatible or incompatible with the migratory materials in a given photopolymerizable layer.

Although it is preferred that the binder in the infrared-sensitive layer adjacent to the photopolymerizable layer is one or a mixture of binders which are substantially incompatible with the migratory materials in the photopolymerizable layer and are at least substantially tack-free, the infrared-sensitive layer can optionally contain one or more secondary binders. The secondary binder may be compatible or somewhat compatible with the migratory materials of the photopolymerizable layer. However, the secondary binder when mixed with the binder does not adversely influence the incompatibility of the binder mixture with the migratory materials. The secondary binder can be used to provide other characteristics not provided by the binder, such as elasticity, scratch resistance, adhesion, and aid in the ablation of the infrared sensitive layer. The secondary binders would satisfy the same additional requirements of the binder described previously, as well as be compatible with the binder.

Examples of the secondary binders suitable for use in the infrared radiation sensitive layer include substituted styrene polymers, such as polystyrene and polyalphamethylstyrene; polyacrylate and polymethacrylate esters, such as polymethylmethacrylate and polybutylmethacrylate; poly(vinyl) chloride; polyvinylidene chloride; polyurethanes; maleic acid resins; and copolymers of the above. Materials which aid in ablation are suitable for use as the secondary binder and include polymers which are thermally decomposable such as homo- and co-polymers of acrylates, methacrylates, and styrene; polycarbonates, polyisobutylene; polybutene; polyvinylacetate; and combinations thereof. Adhesion modifiers are suitable for use as the secondary binder and include copolymers of polyvinylpyrollidone and vinyl acetate, polyvinylpyrollidone, and copolymers of styrene and acrylic acid. The secondary binder can generally be present in amounts of 1 to 40% by weight, based on the total weight of the binder in the infrared sensitive layer adjacent to the phopolymerizable layer.

Any of the above binders and secondary binders and combinations thereof are suitable for use in an infrared sensitive layer which is not adjacent to the photopolymerizable layer, i.e., one or more infrared sensitive layers on top of the infrared sensitive layer adjacent to the photopolymerizable layer.

The thickness of the infrared-sensitive layer should be in a range to optimize both sensitivity and opacity. The layer should be thin enough to provide good sensitivity, i.e., the infrared-sensitive layer should be removed rapidly upon exposure to infrared laser radiation. At the same time, the layer should be opaque enough so that the areas of the layer which remain on the photopolymerizable layer after imagewise exposure effectively mask the photopolymerizable layer from actinic radiation. In general, this layer will have a thickness from about 20 Angstroms to about 50 micrometers. It is preferred that the thickness be from 40 Angstroms to 40 micrometers.

The infrared sensitive composition for the infrared sensitive layer can be prepared by conventional methods of combining the infrared-absorbing agent and/or the radiation-opaque material with the binder. A preferred method for preparing the infrared sensitive composition is to precompound the infrared-absorbing agent and/or the radiation-opaque material with a portion of the total amount of binder, and then add the remainder of the binder, i.e., additional binder, to the precompounded mixture. Adding of the precompounded mixture to the remaining portion of the binder encompasses diluting, mixing, and/or blending. At any point in the precompounding, a solvent such as 80/20 n-butanol/toluene can be used for dispersing the materials used in the diluting, mixing, and/or blending steps. The radiation-opaque material, if needed, can also be added to the mix of the precompounded mixture and additional binder. This method is particularly effective when carbon black or graphite is the infrared absorbing agent (radiation-opaque material). It is preferred that the infrared absorbing material is precompounded with the binder at about 30 to 70 parts per hundred (by weight) of the infrared absorbing material. The weight ratio of precompounded mixture to the additional binder is preferably 1:5 to 5:1. This is done to ensure that the pigmented radiation absorbing material is well dispersed in the binder and that a uniform coating layer is acheived.

The photosensitive element of the invention can also include a temporary coversheet on top of the infrared-sensitive layer. The purpose of the coversheet is to protect the infrared-sensitive layer during storage and handling. The temporary coversheet can also serve as a temporary support for the application of the infrared sensitive layer. It is important that the coversheet be removed prior to exposing the infrared-sensitive layer to infrared laser radiation. Examples of suitable materials for the coversheet include thin films of polyester, polystyrene, polyethylene, polypropylene, polycarbonate, fluoropolymers, and polyamide. The cover sheet may be subbed with release layer/s.

The photosensitive element of the invention is generally prepared by first preparing the photopolymerizable layer on the support and then applying the infrared-sensitive layer by coating or lamination techniques.

The photopolymerizable layer itself can be prepared in many ways by admixing the binder, monomer, initiator, and other ingredients. It is preferred that the photopolymerizable mixture be formed into a hot melt and then calendered to the desired thickness. An extruder can be used to perform the functions of melting, mixing, deaerating and filtering the composition. The extruded mixture is then calendered between the support and a temporary coversheet or between the support and a temporary coversheet which has been previously coated with the infrared sensitive layer. In the latter case it is arranged so that the infrared sensitive layer is next to the photopolymerizable layer during the calendering process. The adhesion between the infrared sensitive layer and the temporary coversheet should be low, so that the infrared sensitive layer will remain intact on the photopolymerizable layer when the temporary coversheet is removed. Alternatively, the photopolymerizable material can be placed between the support and the temporary coversheet or the infrared sensitive layer coated temporary coversheet in a mold. The layers of material are then pressed flat by the application of heat and/or pressure.

The infrared-sensitive layer is generally prepared by coating the infrared-sensitive material onto a temporary coversheet. The infrared-sensitive layer can also be coated directly onto the photopolymerizable layer. The infrared-sensitive layer can be applied using any known coating technique including spray coating.

The final element can also be prepared by removing the coversheet from the photopolymerizable layer of a photopolymerizable printing element and placing it together with the second element (temporary coversheet/infrared-sensitive layer) such that the infrared sensitive layer is adjacent to the photopolymerizable layer. This composite element is then pressed together with moderate pressure. The second temporary coversheet can remain in place for storage, but must be removed prior to infrared laser imaging.

The process of the invention involves (1) providing a photosensitive printing element as described above; (2) removing a coversheet (when present) from the photosensitive element, (3) imagewise ablating layer (c) of the element to form a mask; (4) overall exposing the photosensitive element to actinic radiation through the mask; and (5) treating the product of step (4) with at least one developer solution to remove at least (I) the infrared-sensitive layer which was not removed during step (3), and (II) the areas of the photopolymerizable layer (b) which were not exposed to non-infrared actinic radiation.

The first step in the process of the invention is to provide a photosensitive printing element described above. Suitable methods for preparing this element have been discussed in detail above. Next, when the coversheet is present, it is removed from the photosensitive printing element prior to the imagewise ablation step.

The next step in the process of the invention is to imagewise ablate layer (c) to form a mask. The exposure can be carried out using various types of infrared lasers, which emit in the range 750 to 20,000 nm and preferably in the range 780 to 2,000 nm. Diode lasers emitting in the region of 750 to 880 nm offer substantial advantages in terms of their small size, low cost, stability, reliability, ruggedness and ease of modulation. Diode lasers emitting in the range of 780 to 850 nm may be used to advantage. Such lasers are commercially available from, for example, Spectra Diode Laboratories (San Jose, Calif.). Nd:YAG (Neodymium:Yttrium-Aluminum-Garnet) lasers emitting at 1060 nm are preferred.

In the infrared imagewise ablating step, material in the infrared-sensitive layer is removed, i.e., ablated, in the areas exposed to the infrared laser radiation. The areas exposed to laser radiation in the infrared-sensitive layer correspond to those areas in the photopolymerizable layer which will be polymerized to form the final printing plate. It is preferred that the laser beam exposure impinges the side of the photosensitive element bearing the infrared-sensitive layer. After laser ablation, a pattern of actinic radiation-opaque material remains on the photopolymerizable layer. The areas in which the infrared-sensitive layer remains correspond to the areas of the photopolymerizable layer which will be washed out in the formation of the final printing plate. Although it is desired to remove all the infrared sensitive layer in the ablated areas, traces of some materials in the infrared sensitive layer, particularly the binder, may remain, i.e., be substantially removed but not completely removed, in the areas exposed to the infrared laser radiation. The ablated areas of the infrared sensitive layer may continue to be tack-free or substantially tack-free thus indicating that some binder remains on the element after ablation. However, to the extent that the remaining materials do not deleteriously affect subsequent overall exposure and processing, this is not a particular concern.

The next step in the process of the invention is to overall expose the photosensitive element to actinic radiation through the mask. The type of radiation used is dependent on the type of photoinitiator in the photopolymerizable layer. The radiation-opaque material in the infrared sensitive layer which remains on top of the photopolymerizable layer prevents the material beneath from being exposed to the actinic radiation and hence those areas covered by the radiation-opaque material do not polymerize. The areas not covered by the radiation-opaque material are exposed to actinic radiation and polymerize. Any conventional sources of actinic radiation can be used for this exposure step. Examples of suitable visible or UV sources include carbon arcs, mercury-vapor arcs, fluorescent lamps, electron flash units, electron beam units and photographic flood lamps. The most suitable sources of UV radiation are the mercury-vapor lamps, particularly the sun lamps. A standard radiation source is the Sylvania 350 Blacklight fluorescent lamp (FR 48T12/350 VL/VHO/180, 115 w) which has a central wavelength of emission around 354 nm.

It is contemplated that the imagewise exposure to infrared radiation and the overall exposure to actinic radiation can be carried out in the same equipment. It is preferred that this be done using a drum i.e., the photosensitive element is mounted on a drum which is rotated to allow for exposure of different areas of the element first to infrared laser radiation and then to non-infrared actinic radiation.

The actinic radiation exposure time can vary from a few seconds to minutes, depending upon the intensity and spectral energy distribution of the radiation, its distance from the photosensitive element, and the nature and amount of the photopolymerizable composition. Typically a mercury vapor arc or a sunlamp is used at a distance of about 1.5 to about 60 inches (3.8 to 153 cm) from the photosensitive element. Exposure temperatures are preferably ambient or slightly higher, i.e., about 20° C. to about 35° C.

Conventionally, imagewise exposure of the photosensitive element to actinic radiation is conducted in a vacuum eliminating the presence of atomspheric oxygen. The exposure is conducted in a vacuum to assure intimate contact between the phototool (e.g., negative) and the surface of the photopolymerizable layer and to prevent oxygen from detrimentally affecting the polymerization reactions occuring in the photopolymer layer. (Polymerization reactions require long exposure times and high intensity radiation sources, and the results are less reproducible when oxygen is present.) In the process of the present invention, the overall exposure step can be conducted in a vacuum or can be conducted outside of a vacuum, i.e., while the photosensitive element is in the presence of atmospheric oxygen. It is surprising that the overall exposure step can be conducted outside of a vacuum particularly since the photosensitive element does not have a barrier layer to prevent oxygen affects on polymerization. Overall exposure without a vacuum for the photosensitive element of this invention provides an improvement in product performance in which the side walls of the relief structure of the plate are straighter over a wide range of exposure times, i.e., provide wide exposure latitude. Customers generally favor wide exposure latitude in their processes. Another advantage to conducting the overall exposure step in the absence of a vacuum is that the process becomes simpler and faster since time is not required to draw a vacuum before exposure.

The process of the invention usually includes a back exposure or backflash step. This is a blanket exposure to actinic radiation through the support. It is used to create a shallow layer of polymerized material, or a floor, on the support side of the photopolymerizable layer and to sensitize the photopolymerizable layer. The floor provides improved adhesion between the photopolymerizable layer and the support, helps highlight dot resolution and also establishes the depth of the plate relief. The backflash exposure can take place before, after or during the other imaging steps. It is preferred that it take place just prior to the imagewise exposure to infrared laser radiation on the infrared-sensitive layer side of the element, particularly when the overall exposure is carried out on a drum.

Any of the conventional radiation sources discussed above can be used for the backflash exposure step. Exposure time generally ranges from a few seconds up to about a minute.

Following overall exposure to UV radiation through the mask formed by the actinic radiation-opaque material, the image is treated by washing with a suitable developer. The treating step removes at least the photopolymerizable layer in the areas which were not exposed to non-infrared actinic radiation and the infrared-sensitive layer which was not removed during the ablation step. The treating step may also remove any residual materials of the infrared sensitive layer which were not removed during ablation. The developer removes the non-photopolymerized areas of the photopolymer layer and possibly the infrared-sensitive layer which was not removed during the ablation step. Development is usually carried out at about room temperature. The developers can be organic solutions, water, aqueous or semi-aqueous solutions. When water is used as the developer, the water can contain a surfactant. The choice of the developer will depend on the chemical nature of the photopolymerizable material to be removed. Suitable organic solution developers include aromatic or aliphatic hydrocarbons and aliphatic or aromatic halohydrocarbon solutions, or mixtures of such solutions with suitable alcohols. Other organic solution developers have been disclosed in published German Application 38 28 551 and in U.S. Pat. No. 5,354,645. Suitable semi-aqueous developers usually contain water and a water miscible organic solution and an alkaline material. Suitable aqueous developers usually contain water and an alkaline material. Other suitable aqueous developer combinations are described in U.S. Pat. No. 3,796,602.

Development time can vary, but it is preferably in the range of about 2 to 25 minutes. Developer can be applied in any convenient manner, including immersion, spraying and brush or roller application. Brushing aids can be used to remove the unpolymerized portions of the composition. However, washout is frequently carried out in an automatic processing unit which uses developer and mechanical brushing action to remove the unexposed portions of the plate, leaving a relief constituting the exposed image and the floor.

A pre-development step may be necessary if the infrared-sensitive layer is not removable by the developer solution. An additional developer, which does not affect the polymerized photosensitive material can be applied to remove the infrared-sensitive layer first. This is particularly true when metallic materials are used. In such cases, etching solutions are used, such as 2% aqueous KOH solution.

The pretreating step may not be necessary in the situation in which the photosensitive element includes a infrared sensitive layer having a binder which is not substantially soluble, swellable, dispersible, or liftable in the developer solution for the photopolymer layer. The process of this invention may be simplified by removing the infrared sensitive layer at the same time as the removal of the unexposed portions of the photopolymer layer by use of the mechanical brushing action used in automatic processing units. The infrared sensitive layer is generally much thinner than the photopolymer layer such that with the aid of brushing or brushing with pressure, the infrared layer can be easily removed from the photopolymer layer.

Following solution development, the relief printing plates are generally blotted or wiped dry, and then dried in a forced air or infrared oven. Drying times and temperatures may vary, however, typically the plate is dried for 60 to 120 minutes at 60° C. High temperatures are not recommended because the support can shrink and this can cause registration problems.

Most flexographic printing plates are uniformly post-exposed to ensure that the photopolymerization process is complete and that the plate will remain stable during printing and storage. This post-exposure step utilizes the same radiation source as the main exposure.

Detackification (which can also be referred to as light finishing) is an optional post-development treatment which can be applied if the surface is still tacky, such tackiness not generally being removed in post-exposure. Tackiness can be eliminated by methods well known in the art, such as treatment with bromine or chlorine solutions. Such treatments have been disclosed in, for example, Gruetzmacher, U.S. Pat. No. 4,400,459; Fickes et al., U.S. Pat. No. 4,400,460 and German Patent 28 23 300. Detackification can also be accomplished by exposure to radiation sources having a wavelength not longer than 300 nm, as disclosed in European Published Patent Application 0 017927 and Gibson, U.S. Pat. No. 4,806,506.

These elements can be used to particular advantage in the formation of seamless, continuous printing elements. The photopolymerizable flat sheet elements can be reprocessed by wrapping the element around a cylindrical form, usually a printing sleeve or the printing cylinder itself, and fusing the edges together to form a seamless, continuous element. In a preferred method, the photopolymerizable layer is wrapped around the cylindrical form and the edges joined. One process for joining the edges has been disclosed in German patent DE 28 44 426. The photopolymerizable layer can then be coated with at least one infrared-sensitive layer, e.g., by spray coating.

Continuous printing elements have applications in the flexographic printing of continuous designs such as in wallpaper, decoration and gift wrapping paper. Furthermore, such continuous printing elements are well-suited for mounting on conventional laser equipment. The sleeve or cylinder on which the printing element is wrapped when the edges are fused, can be mounted directly into the laser apparatus where it functions as the rotating drum during the laser exposure step.

In addition, it has been found that the process of the invention can be performed while the plate is mounted in the round, i.e., wrapped around a cylindrical form. Thus, imagewise ablation, overall exposure, development and any additional steps can be performed while the plate is mounted in the round. Other advantages which can be obtained using the instant process include increased process speed, better registration and reduced or, in some cases, no extra mounting time.

Unless otherwise indicated, the term "flexographic printing plate or element" encompasses plates or elements in any form suitable for flexographic printing, including, but not limited to, flat sheets and seamless continuous forms. All publications/references mentioned herein are hereby incorporated by reference unless otherwise indicated.

EXAMPLES

In the following examples, Cyrel®flexographic printing plates, Cyrel® 3040 light source, Cyrel® light finishing unit, Cyrel® rotary processor, and Optisol® rotary solvent, and Mylar® polyester film are products sold by E.I. du Pont de Nemours and Company, Wilmington, DE.

The following examples illustrate the preparation of a photosensitive element having a layer which is sensitive to infrared radiation and the process of making the prepared element into a relief printing plate.

®Example 1

A binder of 50 parts of a polyamide, Macromelt® 6900 (from Henkel Corp., Minneapolis, Minn.) was precompounded with 50 parts of carbon black as the infrared sensitive material (and radiation-opaque material) in a Moriyama mixer. An infrared sensitive composition was prepared by mixing 10 parts of the precompounded carbon black-polyamide with 5 parts of the polyamide in a solvent blend of 80/20 n-butanol/toluene.

The infrared sensitive composition was coated on 5 mil Mylar® polyester film using a postmetering coating method and dried. The infrared sensitive layer on the film, now referred to as the infrared sensitive element, had a dried coating weight of 24 mg/dm$^2$ and a density of 2.6 as read by a MacBeth RD 904 densitometer with a visual filter. The infrared sensitive layer was tack-free.

A photopolymerizable layer was provided by removing an existing coversheet and release layer from the photopolymer layer of a Cyrel® flexographic printing element, type 67HLS. The photopolymerizable layer was the top layer on a support. The infrared sensitive element was laminated at 115.6° C. to the printing element such that the infrared sensitive layer was adjacent to the photopolymer layer. The Mylar® polyester film was removed from the photosensitive printing element, prior to laser ablation. The top surface of the photosensitive printing element was tack-free.

The infrared sensitive layer of the element was imagewise ablated using an experimental laser engraving apparatus equipped with a Nd:YAG laser. The element was mounted on the exterior of a rotating drum using double-sided tape. The laser beam was directed parallel to the axis of the drum, and was directed toward the sample surface with a folding mirror. The folding mirror was stationary and the drum moved parallel to its axis. The laser beam was then focused to impinge on the sample mounted on the drum. As the drum rotated and translated relative to the laser beam, the sample was exposed in a spiral fashion. The laser beam was modulated with image data, i.e., dots, lines, and text characters.

The photosensitive printing element was placed on a drum of the laser writer apparatus, so that the laser beam directly impinged the infrared sensitive layer of the printing element, i.e., the support side of the printing element contacted the drum. The infrared sensitive layer of the photosensitive element was imagewise ablated using a fluence of 3.1 joules/cm$^2$. This resulted in a radiation-opaque patterned mask on the surface of the photosensitive element with a tonal range of 2–95% (120 lines per inch screen). The ablated surface was tack-free. The resulting element was removed from the drum and then given a back flash exposure of 14 seconds on a Cyrel®3040 light source, and then given a top exposure of 9 minutes through the radiation-opaque patterned mask without a vacuum. The exposed element was developed in a Cyrel®rotary processor for 6 minutes using 3:1 mixture (vol/vol) of perclene and butanol. The areas of the infrared sensitive layer which remained after imagewise ablation and the unexposed areas of the photopolymer layer were removed, to form a relief printing plate. The printing plate was oven dried for one hour at 60° C. and then simultaneously post exposed and finished in a Cyrel® light finishing unit for 5 minutes.

Printing was carried out with the printing plate on a Mark Andy Press System 830 (Chesterfield, Mo.) using Film III Dense Black EC 8630 ink (Environmental Inks & Coatings, Morganton, N.C.) diluted to a viscosity of 27 seconds as measured using a Zahn #2 cup. Good printed images were obtained.

Example 2 and Comparative Example

A photosensitive element with the infrared sensitive layer was prepared as described in Example 1 except that a Cyrel®112HOS flexographic printing element (having release layer removed) was substituted for the Cyrel® printing element type 67HLS. A control was made using the same procedure except that the infrared sensitive element was overcoated with Macromelt® 6900 polyamide to form a barrier layer between the infrared sensitive layer and the photopolymerizable layer. The barrier layer had a coating weight of 53 mg/dm$^2$.

After discarding the coversheet, both plates were placed on the laser engine drum held by the double-sided tape as described in Example 1 for imagewise ablation at 3.6 Joules/cm$^2$. The element with the barrier layer gave slightly higher stain level. After removal of the elements from the drum, the control element with the barrier layer had a wrinkled surface. Each element was given 75 seconds of backflash exposure, 12 minutes of overall UV exposure, 9 minutes of development in Perclene/butanol developer, dried for one hour in 60° C. oven, postexposure and light finishing simultaneously for 10 minutes. Both printing plate elements were printed on Mark Andy press. Unexpectedly, printable stretch mark and lower solid density in the solid area were observed for the control plate with the barrier layer only. Printable stretch marks and low solid density in the solid areas are not desired. Apparently, the barrier layer was responsible for these defects. The stretch marks are believed to be a result of stretching of the plate on the drum during laser ablation step and then processing (exposure, development etc.) in the flat form.

Example 3

A photosensitive element with the infrared sensitive layer was prepared as described in Example 1 except that the infrared sensitive layer contained 10 parts of the precompounded carbon black-polyamide with 10 parts of the polyamide in a solvent blend of 80/20 n-butanol/toluene. The infrared sensitive element (the infrared sensitive layer on polyester film), had a density of 2.6 with a coating weight of 36 mg/dm$^2$. The infrared sensitive layer was tack-free when touched. The infrared sensitive element was laminated to the photopolymer layer of a Cyrel®67HLS printing element. After removal of the coversheet, the infrared sensitive layer remained on the photopolymerizable layer and the surface of the photosensitive printing element was tack-free. The photosensitive element was laser ablated at 3.7 J/cm$^2$ fluence and the ablated areas were tack-free. The photosensitive element was processed, dried, finished, and printed as described in Example 1. Good printed images were obtained.

Example 4

A photosensitive element with the infrared sensitive layer was prepared as described in Example 1 except that the infrared sensitive layer contained 50 parts of the polyamide precompounded with 50 parts of carbon black. The infrared sensitive element (the infrared sensitive layer on polyester film), had a density of 2.76 with a coating weight of 14 mg/dm$^2$. The infrared sensitive layer was tack-free. The surface of the photosensitive element remained tack-free after the infrared sensitive layer was applied to the photopolymerizable layer. After removing the coversheet, the photosensitive element was laser ablated at 1.6 Joules/cm$^2$ fluence and the ablated surface areas were tacky. This plate was processed as in Example 1 to give good printed image.

Example 5

The procedure of Example 1 was repeated substituting Cyrel®67HOS flexographic printing element for the Cyrel® printing element type 67HLS. The infrared sensitive layer was tack-free and remained tack-free when applied to the photopolymerizable layer. After removing the coversheet, the photosensitive element with the infrared sensitive layer was exposed, developed, dried, finished and printed as described in Example 1. The printing plate provided a good print image similar to results in Example 1.

Example 6

This example illustrates the process of this invention using a photosensitive element having an organic soluble binder in an infrared sensitive layer on an aqueous processable photopolymerizable layer.

| GLOSSARY | |
|---|---|
| Base 1 | Diethylaminoethyl methacrylate |
| BD | Butadiene |
| BHT | Butylated hydroxytoluene |
| DAM | Diallyl Maleate, MTM- Hardwicke, Inc. (Elgin, SC) |
| DDM | Dodecyl mercaptan |
| t-DDM | Tertiary dodecyl mercaptan |
| HMDA | 1,6-hexanediol diacrylate |
| HEC | Hydroxyethyl Cellulose |
| HPC | Hydroxypropyl cellulose, Klucel ® E–F from Hercules, Inc. (Wilmington, DE) |
| Initiator | 2-Phenyl-2,2-dimethoxyacetophenone |
| Inhibitor | 2,3-diazabicyclo[3.2.2]non-2-ene, 1,4,4-trimethyl-N,N'-dioxide, CAS No. 34122-40-2 |
| Isopar V | $C_{14-18}$ isoparaffinic hydrocarbons, CAS# 64742-46-7, from Exxon Co. (Houston, TX) |
| Lomar PW | Naphthalene sulfonic acid formaldehyde polymer, sodium salt, CAS No. 9084-06-4, from Henkel Corp. (Minneapolis, MN) |
| MAA | Methacrylic Acid |
| NaDDBS | Sodium dodecyl benzene sulfonate |
| NLA | n-Lauryl acrylate |
| Piccotex ® | Substituted polystyrene from Hercules, Inc. (Wilmington, DE) |
| PVP-VA | Poly(vinyl pyrrolidone/vinyl acetate) |
| Rodo No. 0 | Blend of oils used as odor masking agent, from R. T. Vanderbilt (Norwalk, CT) |
| TBP | Tributoxyethyl phosphate |
| Tinuvin ® 1130 | Mixture of polyethylene glycol mono(2-2 (2H-benzotriazol-2-yl)-6-t-butyl-4-(3-methoxy-3-oxypropyl) phenyl)ether and polyethylene glycol bis(2-2(2H-benzotriazol-2-yl)-6-t-butyl-4-(3-methoxy-3-oxypropyl) phenyl) ether, from Ciba-Geigy. |
| TKPP | Tetrapotassium pyrophosphate, from Monsanto Company (St. Louis, MO) |
| Vazo ® 67 | 2,2"-Azo-bis(2-methylbutyronitrile), from E. I. du Pont de Nemours and Company, (Wilmington, DE) |
| Zapon ® 335 | Red dye, CAS No. 73297-15-1. |

A water developable photopolymer plate was prepared with a microgel binder prepared as follows:

I. Preparation of microgel binder

A. Preparation of Water Phase Solution

The water phase solution was composed of the following components:

| Component | Amount (grams) |
|---|---|
| Lomar PW | 56 |
| NaDDBS | 239 |
| Deionized water | 13093 |

NaDDBS and Lomar PW were charged to the water under a nitrogen blanket. The components were mixed until they were dissolved.

B. Preparation of Oil Phase

The oil phase solution was composed of the following components:

| Component | Amount (grams) |
|---|---|
| Styrene | 1332 |
| DDM | 56 |
| Vazo ® 67 | 35 |
| Isopar V | 2244 |
| DAM | 140 |

The DDM and DAM were dissolved in styrene under a nitrogen blanket. The Vazo® 67 was then added and allowed to dissolve. The Isopar V was slowly added to the styrene solution while under a nitrogen blanket.

C. Preparation of Oil Emulsion

The oil phase was added to the water phase, under a nitrogen blanket, keeping the solution mixed. This was then homogenized using a Microfluidizer® M210 (Microfluidics Corp., Newton Mass.) at 3000–6000 psig until the particle size measured 100–250 nm (Gaussion distribution NICOMP Submicron Particle Size Analyzer, Model 270, Pacific Scientific).

D. Butadiene Polymerization

The following composition was used for the polymerization:

| Component | Amount |
|---|---|
| Deionized water | 79.00 pounds |
| Oil emulsion | 52.00 pounds |
| FeSO$_4$ | 0.02 grams |
| TKPP | 33.00 grams |
| BD | 43.18 pounds |

The FeSO$_4$ and TKPPo were dissolved in the deionized water under a nitrogen atmosphere. The oil emulsion was added and this was placed in an autoclave. The BD was added and allowed to swell the oil emulsion droplets for one hour while stirring. The temperature was then raised to 60–65° C. to initiate the polymerization reaction. Polymerization was allowed to proceed until approximately 85% of the BD had polymerized.

The following ingredients were premixed and pumped in at approximately 85% conversion of the BD.

| Component | Amount |
|---|---|
| MAA | 2.27 pounds |
| t-DDM | 0.65 pounds |
| NaDDBS | 0.31 pounds |
| Deionized Water | 22.47 pounds |

The reaction proceeded to completion with approximately 90–95% total conversion. The resulting polymer mooney viscosity was 65. The final particle size was 144 nm (Gaussion distribution NICOMP Submicron Particle Size Analyzer, Model 270 Pacific Scientific).

The above emulsion was freeze dried to remove the water. The result was a solid microgel binder having a core of poly(butadiene/styrene) and a shell of poly(butadiene/methacrylic acid). The percent MAA was 3.9%.

II. Preparation of photosensitive element containing a aqueous developable photopolymer layer A photosensitive composition was prepared from the following components:

| Component | Parts by Weight |
|---|---|
| Microgel binder (prepared in A) | 65.1 |
| HMDA | 4.0 |
| NLA | 4.9 |
| Base 1 | 9.8 |
| TBP | 4.9 |
| Initiator | 3.0 |
| BHT | 2.0 |
| Inhibitor | 0.1 |
| Piccotex ® | 5.0 |
| PVP-VA | 1.0 |
| Zapon ® 335 | 0.01 |
| Tinuvin ® 1130 | 0.1 |
| Rodo ® No. 0 | 0.1 |

A coversheet was prepared by coating a 5 mil (0.013 cm) sheet of polyethylene terephthalate with a layer of a 2 blend of HPC and HEC at a coating weight of 20 mg/dm A support was 7 mil (0.018 cm) polyethylene terephthalate which was flame-treated.

The components of the photosensitive composition were fed into a 30 mm twin screw extruder which performed the functions of melting, mixing, deaerating and filtering the composition. The material was extruded at 135° C. through a die into the rotating bank of a two-roll calender, and then calendered between the support film and the cover sheet.

III. Preparation of photopolymer element from step II with an infrared sensitive layer The infrared sensitive element was prepared as described in Example 1. The infrared sensitive element was laminated to the freshly extruded aqueous developable photopolymer element prepared above by temporarily attaching the infrared sensitive element to the coversheet, i.e., piggy-back mode, such that the infrared sensitive layer was adjacent to the aqueous photopolymer layer. After calendering, the portion of the photosensitive element having the infrared sensitive layer was cut out of the calendered element. Since there was no adhesive layer or adhesiveness between the coversheet and the Mylar® polyester support of the infrared sensitive element, the original coversheet was easily removed from the polyester film of the infrared sensitive element.

The resulting photosensitive element had a total thickness of 0.062 in (1.57 mm). The photosensitive element also had the desired adhesion balance in that the organo soluble infrared sensitive layer adhered to the aqueous photopolymer surface and the lowest adhesion of the layers for the element structure was the Mylar® polyester to the infrared sensitive layer. As desired, the surface of the resulting photosensitive element was tack-free.

IV. Process for making a flexographic printing plate

The photosensitive element formed in step III was given a back flash exposure of 30 seconds on Cyrel® 3040 exposure unit. The Mylar polyester was removed from the infrared sensitive layer of the photosensitive element and the infrared sensitive layer was imagewise ablated as described in Example 1 using the Nd:YAG laser with 2.75 joules/cm$^2$ fluence. The unablated and ablated areas were tack-free. A tonal range of 2–95% was resolved using 120 line per inch screen.

After imagewise laser ablating the infrared sensitive layer, the photosensitive element was given a top exposure, i.e., through the radiation-opaque patterned mask, for 3 minutes without the vacuum. The element was developed in a rotary processor using brushes and with tap water at room temperature for 10 minutes. The infrared-sensitive layer was removed with the unpolymerized aqueous photopolymer as desired. It was rinsed with fresh water and then dried in a 60 degree centigrade oven for 15 minutes. Good images were obtained.

Example 7

An aqueous developable photopolymer layer was obtained from an aqueous developable flexographic plate, identified as aqueous plate for flexography from Nippon Zeon Co. (0.067 in thickness) having a cover sheet and a release layer. The plate was modified by discarding the coversheet and removing the tack-free release layer by wiping the plate surface with a wet towel (soaked with water). The plate surface of the photopolymer layer became tacky after allowing to dry in the room. The modified plate was then hot laminated with the infrared sensitive element as described in the Example 1 such that the solvent soluble infrared sensitive layer was adjacent to the aqueous photopolymer layer. The resulting photosensitive element had good black density and good adhesion balance such that the Mylar® polyester coversheet was removed cleanly from the infrared-sensitive layer of the photosensitive element. The surface of the element was tack-free. The photosensitive element was imagewise ablated with Nd:YAG laser at the fluence of 2.5 joule/cm$^2$ as described in Example 1. The ablated areas were tack-free. The element was back flashed 20 seconds, and was given a main UV overall exposure through the laser ablated, radiation opaque mask for 3 minutes (without vacuum). The element was developed in hot water (150° F.) with 1% surfactant in a processor with brushes for 10 minutes and dried for 15 minutes in a 60° C. oven. Good images were obtained.

Example 8

This example illustrates the preparation of a photosensitive element having an infrared sensitive layer which contains a mixture of binders of polyvinyl alcohol and styrene-acrylic acid.

An infrared-sensitive composition was prepared from the following ingredients to form a solution:

| | |
|---|---|
| Flexiverse ® radiation black aqueous dispersion containing 45% solid (30% black pigment and 15% copolymer binder of styrene and acrylic acid)sold by Sun Chemical Co. (Amelia, OH) | 10 g. |
| Distilled water | 20 gr. |
| 10% Elvanol 50-42 a polyvinyl alcohol in aqueous solution (sold by DuPont, Wilm. DE) | 30 gr. |
| 10% Triton X-100 surfactant | 1 gr. |

The solution was coated onto a 5 mil Mylar__ AR support with a 2 mil knife and room dried. The infrared sensitive layer on the film, now referred to as the infrared sensitive element, had a dried coating weight of 27.8 mg/dm$^2$ and an optical density of 4.0. The coating quality was good.

A photopolymerizable layer was provided by removing an existing coversheet and release layer from the photopolymer layer of a Cyrel® flexographic printing element, type 30 CP. The photopolymerizable layer was tacky as the top layer on a support. The infrared sensitive element was laminated to the tacky photopolymerizable surface such that the infrared sensitive layer was in direct contact with the photopolymer layer. The Mylar® support of the infrared sensitive element (now a coversheet) was removed from the photosensitive element. The infrared sensitive layer adhered to the photopolymer layer and the surface of the infrared sensitive layer remained tack-free as desired.

The resulting photosensitive element can then be imagewise laser ablated to create a mask in-situ on the photopolymerizable layer, back flashed and overall UV exposed, developed in solvent (where the processor has brushes under pressure), dried and post treated as described in Example 1 and is expected to give printing images.

Example 9

An infrared-sensitive composition was prepared from the following ingredients to form a solution:

| | |
|---|---|
| Flexiverse ® black aqueous dispersion | 10 g |
| Distilled water | 30 g |
| Hydroxyl ethyl cellulose | 1.435 g |
| Hydroxy propyl cellulose | 1.435 g |
| 10% zonyl FSN surfactant | 0.26 g |

The solution was coated onto a 5 mil Mylar® AR support with a 2 mil knife and room dried. The infrared sensitive layer on the film, now referred to as the infrared sensitive element, had a dried coating weight of 53.2 mg/cm$^2$ and an optical density of 3.91.

A photopolymerizable layer was provided by removing an existing coversheet and release layer from the photopolymer layer of a Cyrel® flexographic printing element, type 30 CP. The photopolymerizable layer was tacky as the top layer on a support. The infrared sensitive element was laminated to the tacky photopolymerizable surface such that the infrared sensitive layer was in direct contact with the photopolymer layer. The Mylar® support of the infrared sensitive element (now a coversheet) was removed from the photosensitive element. The infrared sensitive layer had correct adhesion balance, that it is adhered to the photopolymer layer, and the surface of the infrared sensitive layer remained tack-free as desired.

Example 10

An infrared sensitive composition was prepared from 10 parts of the precompounded carbon black polyamide (50 parts carbon black and 50 parts polyamide) mixture of Example 1 and 20 parts of polyamide in a solvent blend of 80/20 n-butanol/butanol. The infrared sensitive composition was coated on 5 mil Mylar® polyester film. The dried coating of the infrared sensitive layer had a density of 2.45 with a coating weight of 47 mg/dm². The infrared sensitive layer on the polyester was laminated as described in Example 1 to a Cyrel® flexographic printing element, type 67 HOS, which had the coversheet and release layer removed. After removal of the Mylar® polyester film, the photosensitive element was laser ablated imagewise at 5.2 Joules/cm². Both the surface of the ablated and the surface of the unablated areas were tack-free. The photosensitive element was exposed and processed as described in Example 1, resulting in a plate with good image quality.

Example 11

An infrared sensitive composition is prepared from, 10 parts of precompounded carbon black polyamide mixture (50 parts carbon black and 50 parts polyamide) of Example 1, 6 parts of polyamide and 4 parts of an amphomer. A suggested amphomer is formed (by weight) from 40% N-tert.-octylacrylamide, 34% methylmethacrylate, 16% acrylic acid, 6% hydroxypropyl methacrylate, and 4% t-butyl amino ethyl methacrylate. As described in Example 1, the infrared sensitive composition is coated and is laminated to a Cyrel® flexographic printing element, type 67 HO, with the coversheet and release layer removed. The resulting photosenstive element is expected to ablate, expose and process to provide good results as the Example 1.

Example 12

An infrared-sensitive layer on a flexographic photosensitive printing element was prepared as follows:

An infrared sensitive composition was prepared using a mixture of binders. Dispercel® CBJ is a solid dispersion from Runnemede Dispersions KV (UK) containing 45% carbon black, 35% nitrocellulose, and the remainder plasticizer and dispersant. This was dispersed in methanol at 12% solids to form a "Dispercel® Stock Solution".

The other binder component was introduced by precompounding 67% Macromelt® polyamide with 33% carbon black. This mixture was dispersed at 12% solids in n-propanol to form a "Macromelt®Stock Solution".

80 parts of the Dispercel® Stock Solution and 20 parts of the Macromelt® Stock Solution were mixed.

A cover sheet was removed from a Cyrel® HOS45 printing element to reveal a release layer on a 45 mil photopolymerizable layer. The release layer was removed by using adhesive tape to lift and peel the release layer from the photopolymerizable layer. The infrared-sensitive solution was coated with a wire-wound bar directly onto the photopolymerizable layer of the plate. The top surface of the photosensitive element was tack-free.

The photosensitive element with the infrared-sensitive layer was cut into samples and laser exposed as described in Example 1 except that the exposure fluence was varied.

The infrared sensitive layer of all samples was successfully imagewise ablated at the different exposure fluences. At low exposure fluences, the resulting stain in the ablated areas (as determined by optical density (OD)) decreases with increasing exposure fluence.

What is claimed is:

1. A photosensitive element for use as a photopolymer printing plate, comprising:
    (a) a support;
    (b) at least one layer of a photopolymerizable material on the support, the photopolymerizable material comprising at least one elastomeric binder, at least one monomer, at least one initiator having sensitivity to non-infrared actinic radiation, and optionally at least one plasticizer, wherein at least one of the monomer and the optional plasticizer is a low molecular weight material having a weight average molecular weight of 30,000 or less; and
    (c) at least one infrared ablation layer which is ablatable by infrared radiation and opaque to non-infrared actinic radiation and wherein the infrared ablation layer is in direct contact with the at least one photopolymerizable layer (b), and has a surface opposite the photopolymerizable layer (b) capable of being exposed to laser oblation, the infrared ablation layer comprising:
        (i) at least one infrared absorbing material;
        (ii) a radiation opaque material, wherein (i) and (ii) can be the same or different; and
        (iii) at least one binder which is incompatible or substantially incompatible with at least one of the low molecular weight materials of layer (b);
    wherein the infrared ablation layer is tack-free or substantially tack-free such that the surface of the infrared sensitive layer adjacent to the photopolymerizable layer is tack-free or only slightly tacky, sticky or oily to the touch and is ablatable from the surface of the photopolymerizable layer upon exposure to infrared laser radiation.

2. The element of claim 1, wherein the at least one binder (iii) is selected from the group consisting of polyamides, polyvinyl alcohol, amphoteric interpolymers, alkylcellulose, hydroxyalkyl cellulose, nitrocellulose, copolymers of ethylene and vinyl acetate, cellulose acetate butyrate, polybutyrals, cyclic rubbers, and combinations thereof.

3. The element of claim 1, wherein the at least one binder (iii) is tack-free or substantially tack-free.

4. The element of claim 1, wherein the infrared ablation layer further comprises a secondary binder selected from the group consisting of copolymers of styrene and acrylic acid, copolymers of polyvinylpyrollidone and vinyl acetate, and polyvinylpyrollidone.

5. The element of claim 1, wherein the infrared absorbing material or the radiation opaque material or both the radiation opaque material and the radiation opaque material are non-migratory.

6. The element of claim 1, wherein the infrared absorbing material (i) is the same as the radiation opaque material (ii) and is 10 to 60 % by weight based on the total weight of the infrared ablation layer.

7. The element of claim 6, wherein the infrared absorbing material is selected from the group consisting of carbon black, graphite, and mixtures thereof.

8. The element of claim 7, wherein the binder (iii) is selected from the group consisting of polyamides and a mixture of polyamides and amphoteric interpolymers.

9. The element of claim 1, wherein the at least one plasticizer is present and wherein the binder (iii) is substantially incompatible with the at least one monomer and the at least one plasticizer.

10. The element of claim 1, wherein the low molecular weight is a weight average molecular weight and is less than 5000.

11. A photosensitive element for use as a photopolymer printing plate, comprising:
  (a) a support;
  (b) at least one layer of a photopolymerizable material on the support, the photopolymerizable material comprising at least one elastomeric binder, at least one monomer, at least one initiator having sensitivity to non-infrared actinic radiation, and optionally at least one plasticizer, wherein at least one of the monomer and the optional plasticizer is a low molecular weight material having a weight average molecular weight of 30,000 or less; and
  (c) at least one infrared ablation layer which is ablatable by infrared radiation and opaque to non-infrared actinic radiation on at least one layer of photopolymerizable material (b) such that the infrared ablation layer is in direct contact with the at least one photopolymerizable layer (b), and has a surface opposite the photopolymerizable layer (b) capable of being exposed to laser ablation, the infrared ablation layer comprising:
    (i) at least one infrared absorbing material;
    (ii) a radiation opaque material, wherein (i) and (ii) can be the same or different; and
    (iii) at least one binder which is incompatible with at least one of the low molecular weight materials of layer (b), wherein the infrared ablation layer is tack-free or substantially tack-free when on the photopolymerizable layer; and
  (d) a temporary coversheet which must be removed before the photosensitive element is exposed imagewise to infrared radiation wherein the adhesion between the temporary coversheet and layer (c) is so low that layer (c) remains intact upon removal of the temporary coversheet.

12. A photosensitive element according to claim 11 wherein the temporary coversheet comprises a material selected from polyester, polystyrene, polyethylene, polypropylene, polycarbonate, fluoropolymers or polyamide and wherein the temporary coversheet is optionally subbed with a release layer.

* * * * *

UNITED STATES PATENT AND TRADEMARK OFFICE
CERTIFICATE OF CORRECTION

PATENT NO. : 6,238,837 B1 Page 1 of 1
DATED : May 29, 2001
INVENTOR(S) : Roxy Ni Fan It is certified that error appears in the above-identified patent and that said Letters Patent is hereby corrected as shown below:

Title page,
Item [56], References Cited, U.S. PATENT DOCUMENTS should include
-- 4,132,168  1/1979  Peterson ............ 101/471
   5,262,275  11/1993 Fan .................. 430/273 --

Item [56], References Cited, FOREIGN PATENT DOCUMENTS should include
-- 0 634 695A1 1/1995 (EP) .................... G03F/1/00
   WO 94/03839 2/1994 (WO) ................ G03F7/095 --

Column 24,
Line 3, "printing plate, comprising" should read -- printing plate comprising --.
Line 20, "oblation" should read -- ablation --.

Signed and Sealed this

Twenty-first Day of January, 2002

JAMES E. ROGAN
*Director of the United States Patent and Trademark Office*